US012774536B2

(12) United States Patent
Coll et al.

(10) Patent No.: US 12,774,536 B2
(45) Date of Patent: Oct. 27, 2026

(54) LOW FRACTURE ENERGY ACOUSTIC LIFT-OFF

(71) Applicant: Crystal Sonic, Inc., Phoenix, AZ (US)

(72) Inventors: Pablo Guimerá Coll, Tempe, AZ (US); Lara Bathurst, Lafayette, CA (US); Mariana Bertoni, Phoenix, AZ (US); Arno Merkle, Phoenix, AZ (US)

(73) Assignee: Crystal Sonic, Inc., Phoenix, AZ (US)

( * ) Notice: Subject to any disclaimer, the term of this patent is extended or adjusted under 35 U.S.C. 154(b) by 293 days.

(21) Appl. No.: 18/750,231

(22) Filed: Jun. 21, 2024

(65) Prior Publication Data

US 2025/0389054 A1 Dec. 25, 2025

(51) Int. Cl.

| | |
|---|---|
| ***C30B 33/00*** | (2006.01) |
| ***C30B 19/12*** | (2006.01) |
| ***C30B 23/02*** | (2006.01) |
| ***C30B 25/18*** | (2006.01) |
| ***H10P 14/20*** | (2026.01) |

(52) U.S. Cl.

CPC .............. *C30B 33/00* (2013.01); *C30B 19/12* (2013.01); *C30B 23/025* (2013.01); *C30B 25/186* (2013.01); *H10P 14/3246* (2026.01); *H10P 14/38* (2026.01)

(58) Field of Classification Search

CPC ..... C30B 25/186; C30B 23/025; C30B 19/12; C30B 33/00; H10P 14/3246; H10P 14/38

See application file for complete search history.

(56) References Cited

U.S. PATENT DOCUMENTS

| | | | | |
|---|---|---|---|---|
| 8,158,496 | B2 * | 4/2012 | Lee | H10P 14/3416 438/483 |
| 8,946,054 | B2 | 2/2015 | Bedell et al. | |
| 9,058,990 | B1 | 6/2015 | Bayram et al. | |
| 10,770,289 | B2 | 9/2020 | Kim | |
| 2005/0282357 | A1 | 12/2005 | Takayama et al. | |
| 2009/0117675 | A1 | 5/2009 | Yamanaka et al. | |
| 2015/0048301 | A1 | 2/2015 | Kilbury et al. | |
| 2015/0179428 | A1 | 6/2015 | Bayram et al. | |
| 2016/0072071 | A1 | 3/2016 | Yumura | |

(Continued)

FOREIGN PATENT DOCUMENTS

| | | | |
|---|---|---|---|
| KR | 1137514 | B1 | 4/2012 |
| TW | 201505082 | A | 2/2015 |
| WO | 2020072871 | A1 | 4/2020 |

OTHER PUBLICATIONS

PCT/US2025/030501, "PCT Notification of Transmittal of the International Search Report and the Written Opinion of the International Searching Authority, or the Declaration", mailed Sep. 2, 2025, 8 pages.

*Primary Examiner* — Vishal I Patel
(74) *Attorney, Agent, or Firm* — Aikin & Gallant, LLP

(57) ABSTRACT

Methods for acoustically separating an epitaxial layer or device from a growth substrate are described. In an embodiment, a particle layer is deposited on a first top surface of the growth substrate to provide partial coverage of the first top surface, an epitaxial layer is deposited over the particle layer and a remaining uncovered portion of the first top surface, and acoustic waves are directed at the growth substrate to initiate controlled crack propagation along the particle layer and separate the epitaxial layer from the first top surface, creating a second top surface of the growth substrate.

20 Claims, 9 Drawing Sheets

(56) References Cited

U.S. PATENT DOCUMENTS

| | | | |
|---|---|---|---|
| 2016/0307792 | A1 | 10/2016 | Werner et al. |
| 2019/0061198 | A1* | 2/2019 | Bertoni .................. B26D 7/086 |
| 2020/0043790 | A1* | 2/2020 | Lee ..................... H10P 14/3221 |
| 2020/0286786 | A1 | 9/2020 | Kim et al. |
| 2021/0351033 | A1 | 11/2021 | Kim et al. |
| 2022/0102578 | A1 | 3/2022 | Steiner |
| 2024/0178017 | A1 | 5/2024 | You et al. |

* cited by examiner

LOW FRACTURE ENERGY ACOUSTIC LIFT-OFF

BACKGROUND

Field

Embodiments described herein relate to semiconductor manufacturing and equipment, and more particularly to layer transfer.

Background Information

As the photovoltaics and various power electronics industries move towards non-silicon materials, there is a related drive for the growth of semiconductor devices on the same or dissimilar growth substrates including silicon (Si), gallium arsenide (GaAs), indium phosphide (InP), gallium nitride (GaN), silicon carbide (SiC), aluminum nitride (AlN), diamond, etc. After the growth of the semiconductor device layers, the growth substrate must then be subsequently removed. In traditional fabrication techniques, the growth substrate may be removed by backgrinding. However, backgrinding wastes large portions of the growth substrate material that might otherwise be useable to grow additional semiconductor devices. Since growth substrates represent a significant percent of the overall device cost, it has been proposed to reuse or reclaim the growth substrates in order to recoup costs.

SUMMARY

Methods for acoustically separating an epitaxial layer or device from a growth substrate are described. In an embodiment, a particle layer may be deposited on a top surface of a growth substrate where the particle layer provides at least partial coverage of the top surface, an epitaxial layer may be deposited over the particle layer (and any remaining uncovered portion of the top surface of the growth substrate), and acoustic waves may then be direct at the growth substrate where the acoustic waves stimulate the particles in the particle layer and initiate controlled crack propagation. In such instances, the controlled crack propagation may occur through the epitaxial layer, through the growth substrate, along an interface between the epitaxial layer and the substrate or any combination thereof.

DETAILED DESCRIPTION

Figure 1:
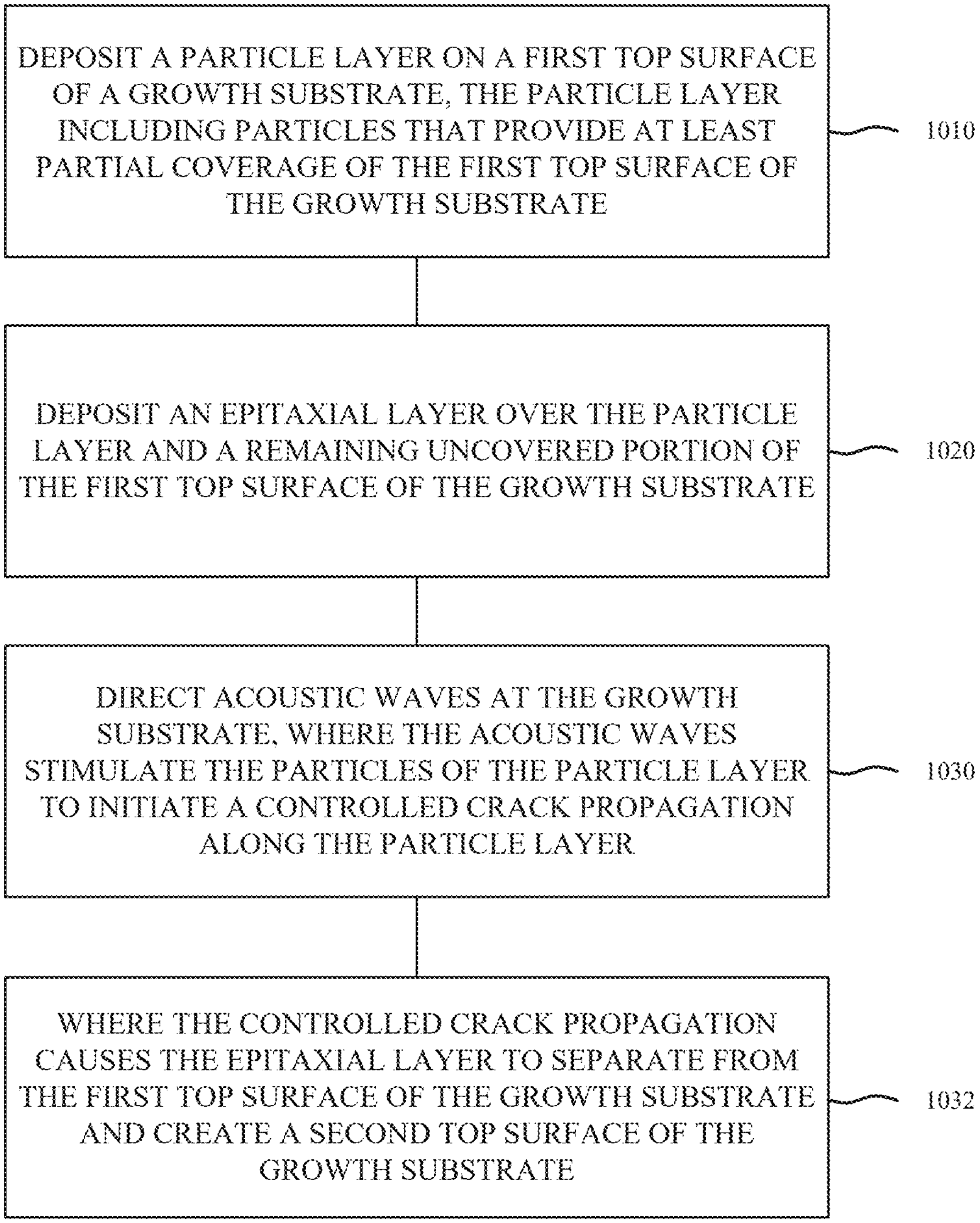
FIG. 1 is a process flow of a method for acoustically separating an epitaxial layer from a growth substrate in accordance with an embodiment.

In the process of reusing or reclaiming a growth substrate, costs can be driven by various factors such as the growth substrate price, the number of reuses, and the cost of chemical-mechanical polishing (CMP). A variety of industrially adapted approaches have been employed to separate an epitaxial layer or device from a growth substrate with an aim toward maximizing the portion of the growth substrate to be reused or reclaimed. For example, such approaches include epitaxial lift-off (ELO), epitaxial transfer, ChipFilm technology, deep reactive-ion etching (DRIE), controlled spalling, ion-implantation, remote epitaxy and laser lift off (LLO). However, it has been observed that these approaches may diminish the quality of the growth substrate and epitaxial or device layers as well as incorporate additional costly processing steps. More recently it has been proposed in U.S. Pat. No. 10,828,800 to utilize sound-assisted crack propagation for semiconductor wafering. In such an implementation, it is proposed to form a premade crack in a growth substrate, apply a first stress to the material below a critical point of the material that is insufficient to initiate cracking, then to apply a controlled ultrasonic wave to the material causing the total stress applied at the crack tip in the material to exceed a critical point. The ultrasound wave can then be controlled to propagate cracking of the material.

In accordance with embodiments, methods for acoustically separating an epitaxial or device layers from a growth substrate include depositing a particle layer on a top side of the growth substrate, depositing an epitaxial or device layer over the particle layer and any uncovered portion of the top side of the growth substrate, and then directing acoustic waves at the growth substrate to stimulate the particles of the particle layer and initiate a controlled crack propagation along the particle layer. In some embodiments, the particle layer provides full coverage of the top surface of the growth substrate. In other embodiments, the particle layer provides only partial coverage of the top surface of the growth substrate. In addition, the stress generated by the particle layer formation and application of acoustic energy can be used in combination with other stress generating manners such as formation of a premade crack or notch in the growth substrate, applying a base stress to the workpiece including the growth substrate and epitaxial or device layer, etc. or may alternatively supply sufficient stress such that other stress generating methods are not necessary.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 2A:
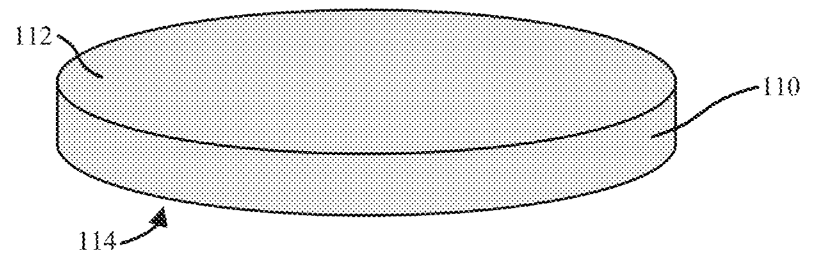
FIG. 2A-2D are schematic perspective view illustrations of a method for acoustically separating an epitaxial layer from a growth substrate in accordance with an embodiment.

FIG. 1 is a flow chart and FIGS. 2A-2D are perspective view illustrations of a method for acoustically separating an epitaxial or device layer from a growth substrate. In the interest of clarity and conciseness, the method of FIG. 1 is described concurrently with the illustrations of FIGS. 2A-2D. As shown in FIG. 2A, the process sequence can begin at operation 1010 with growth substrate 110. Growth substrate 110 may serve as the base upon which a particle layer may be deposited (e.g., particle layer 120, etc.) and upon which a device or structure may be built (e.g., epitaxial layer 130). A growth substrate may typically have a thickness in the range of 100-1,000 microns and may be formed of materials such as silicon (Si), gallium arsenide (GaAs), indium phosphide (InP), gallium nitride (GaN), silicon carbide (SiC), aluminum nitride (AlN), diamond or germanium (Ge), although other growth substrate thicknesses and materials are contemplated. In the example of FIG. 2A, growth substrate 110 includes a first top surface 112 and a bottom surface 114.

Figure 2B:
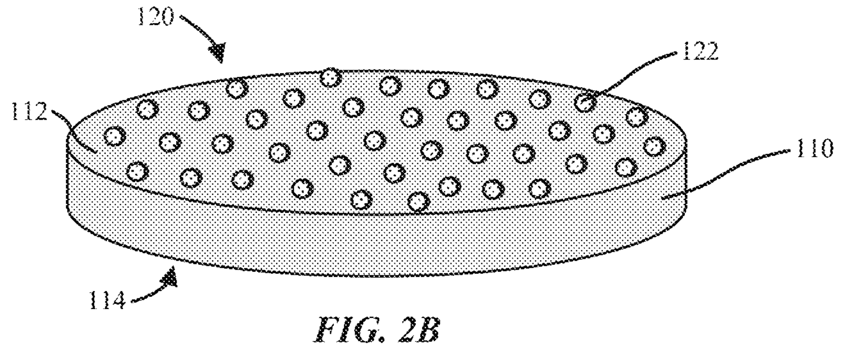

Further, as shown in FIG. 2B at operation 1010, particle layer 120 may be deposited on first top surface 112 of growth substrate 110. It should be noted that the particles of particle layer 120 as illustrated in the figures are not to scale and have been enhanced for illustrative purposes. The particles that make up the particle layer may be crystalline or amorphous, which may determine the shape of the particles. For example, crystalline particles may intrinsically possess (or may be synthesized to include) non-spherical shapes (e.g., cubes, rods, etc.), whereas amorphous particles may intrinsically adopt spherical shapes but may still be synthesized to include non-spherical shapes. In addition, the sizes of the particles in the particle layer may range from nanoparticle sizes (e.g., 0.1-100 nanometers in diameter) to fine particle sizes (e.g., 100-2500 nanometers in diameter), where the particles and the particle layer may include different porosity values ranging from 0% to 99%. Further, the particles that make up the particle layer may be composed of any solid or liquid material, such as metals, dielectrics, semiconductors, composites, etc. In the example of FIG. 2A, particles 122 of particle layer 120 are spherical silica nanoparticles.

The particle layer may provide at least partial coverage of the top surface of the growth substrate. In addition, the particle layer may be formed by multiple different methods depending on the desired particle size, packing density, porosity, layer thickness, ability to use different particles, and the complexity of the method and instrumentation needed. For example, the particle layer may be formed by deposition methods such as dip-coating, spin-coating, Langmuir-Schaefer coating, Langmuir-Blodgett coating, sol-gel, solvent evaporation, doctor blade coating, spray-coating, vapor deposition processes, electroplating, thermal evaporation, e-beam evaporation, as well as other methods. In addition, as discussed below in the context of FIGS. 3A-3B and FIGS. 4A-4B, the particle layer may include monolayer or multilayer coverage, where each monolayer or multilayer may either partially or fully cover the top surface of the growth substrate (or an underlying particle layer). In the example of FIG. 2B, particles 122 of particle layer 120 are deposited as a partial monolayer on first top surface 112 of growth substrate 110.

Figure 2C:
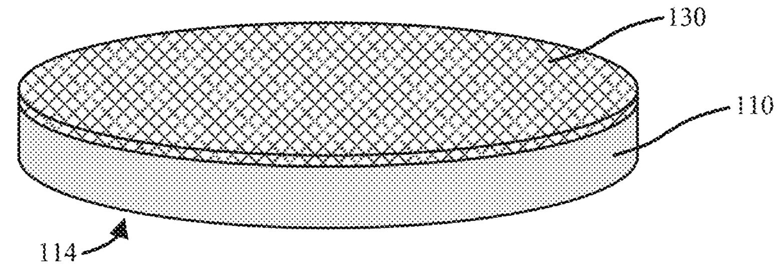

At operation 1020, FIG. 2C shows an epitaxial or device layer 130 deposited over particle layer 120 and over a remaining uncovered portion of first top surface 112 of growth substrate 110. The epitaxial layer may include a buffer layer to absorb stress and defects from lattice mismatch (e.g., GaInP buffer layer, etc.) followed by various additional functional device layers (e.g., charge transport layers, active layers, drift layers, blocking layers, confinement layers, etc.) formed of material such as, but not limited to, GaAs, InAlP and GaInP, a GaAlAs current spreading layer and a metal electrode layer (e.g. Au). Such device layers may be utilized for a variety of electronic and optoelectronic functions and may be based on III-V and/or II-VI semiconductor structures, for example. In addition, the epitaxial layer may be deposited with any type of epitaxial technique (e.g., molecular beam epitaxy, chemical vapor deposition, atomic layer deposition, liquid-phase epitaxy, chemical beam epitaxy, etc.).

Figure 2D:
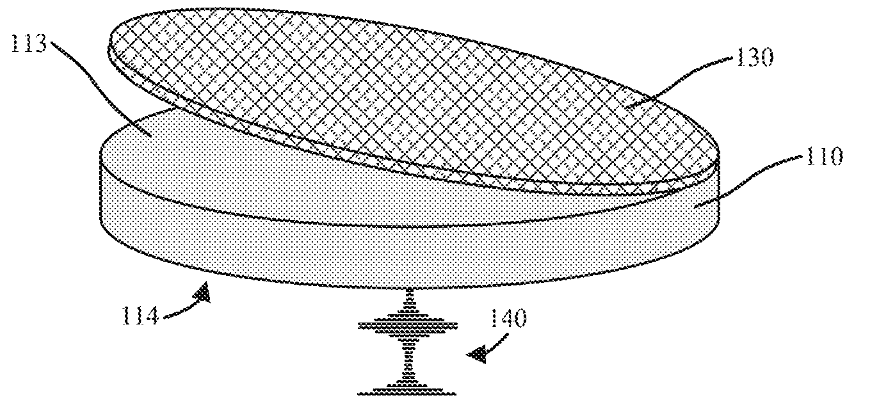

Referring now to FIG. 2D, at operation 1030 acoustic waves 140 may be directed at bottom or top surface 114 of growth substrate 110 to stimulate particles 122 of particle layer 120 and initiate a controlled crack propagation along the particle layer. In such instances, the stimulation of the particles in the particle layer generates an amount of energy or stress equal to or greater than the minimum amount of energy or stress required to initiate controlled crack propagation. In addition, the frequency of the acoustic waves may vary based on the characteristics of the particles (e.g., size, shape, composition, etc.). For example, the frequency of the acoustic waves may range from approximately 20 Hz to 500 GHz. In some embodiments, the acoustic waves may cause the particles of the particle layer to vibrate, which may in and of itself initiate controlled crack propagation across the particle layer. In other embodiments, the wavelength of the acoustic waves and/or the characteristics of the particles in the particle layer may be tuned so that the acoustic waves match the natural frequency of the particles, thereby causing the particles of the particle layer to vibrate with an even larger amplitude (e.g., resonate), which may also initiate controlled crack propagation. In other embodiments still, the particles of the particle layer may be stimulated by the acoustic waves so that the particles break or burst, which may then initiate controlled crack propagation.

Further in FIG. 2D, at operation 1032 acoustic waves 140 stimulate particles 122 of particle layer 120 to initiate a controlled crack propagation along particle layer 120 to cause epitaxial layer 130 to separate from growth substrate 110. In embodiments, a crack may propagate through epitaxial layer 130 (e.g., buffer layer), through growth substrate 110, at an interface between both layers, or through both layers (e.g., propagating from the epitaxial layer to the growth substrate, etc.). In the example of FIG. 2D, the controlled crack propagates through growth substrate 110 to create a second top surface 113 of growth substrate 110, which can then be reclaimed and re-used multiple times for the growth of subsequent devices layers.

Figure 2E:
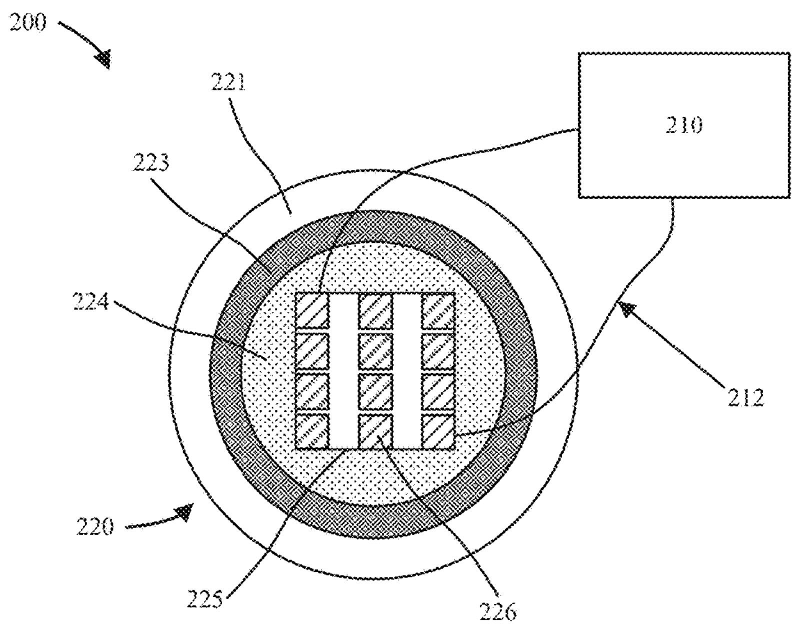
FIG. 2E is a schematic top view illustration of an acoustic lift-off apparatus in accordance with an embodiment.
Figure 2F:
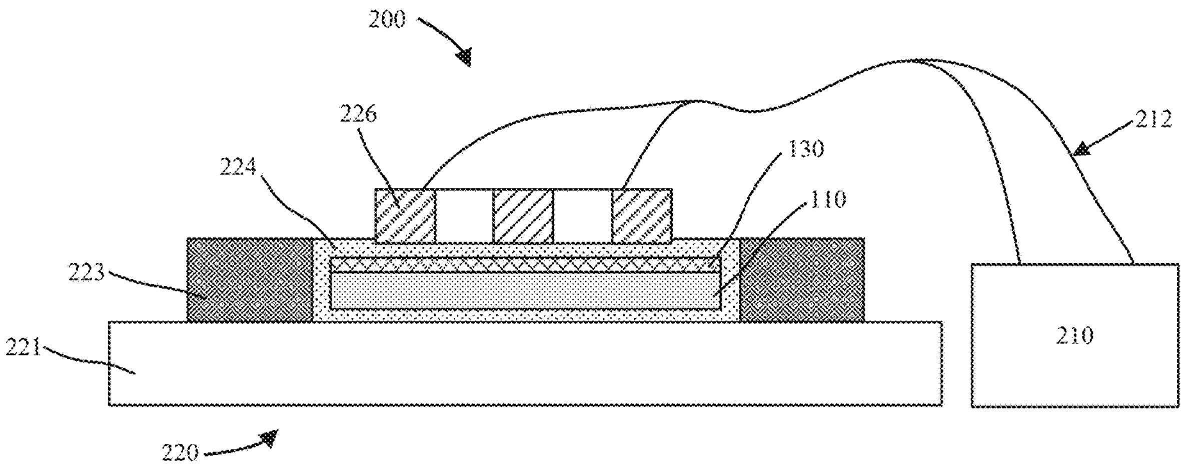
FIG. 2F is a schematic cross-sectional side view illustration of an acoustic lift-off apparatus in accordance with an embodiment.

Referring now to FIG. 2E and FIG. 2F, FIG. 2E is a schematic top view illustration of an acoustic lift-off apparatus; and FIG. 2F is a schematic cross-sectional side view illustration of an acoustic lift-off apparatus. An acoustic lift-off apparatus may be utilized to generate, direct, and modulate acoustic waves to separate an epitaxial layer from a growth substrate, such as described in the example of FIGS. 2A-2D. In the example of FIG. 2E and FIG. 2F, acoustic lift-off apparatus 200 includes electronic system 210 and acoustic system 220, which are connected by leads 212 (e.g. wires). Electronic system 210 may include any combination of energy storage components (e.g., battery, capacitor, etc.), switches, voltage sources, amplifiers, relays, pulsers, etc. In addition, electronic system 210 may also include other circuit components designed to reduce or increase the inductance, voltage overshoots, ringing and flyback voltage of the system, including opto-oscillators, Schmitt triggers, etc.

Further, acoustic lift-off apparatus 200 includes acoustic system 220, which may include substrate holder 221 and acoustic enclosure 223 to receive the workpiece including the growth substrate/epitaxial layer. Acoustic system 220 also includes acoustic device 225, which may include one or more acoustic generators 226 (e.g., piezoelectric material, etc.). Acoustic generators 226 may be located on one side, multiple sides, or every side of the workpiece including the growth substrate and/or epitaxial layer. In addition, acoustic generators 226 may be assembled from one or several layers of piezoelectric material, where the assembly of acoustic generators 226 can form a variety of shapes, including but not limited to circular, square, or rectangular shapes, that may be the same or dissimilar to the shape of the growth substrate/epitaxial layer. Further, acoustic generators 226 may be in direct contact with the growth substrate/epitaxial layer or they may be separated by a coupling agent (e.g., adhesive layer, ultrasonic gel, etc.), such as coupling agent 224 in the example of FIG. 2F.

Figure 3A:
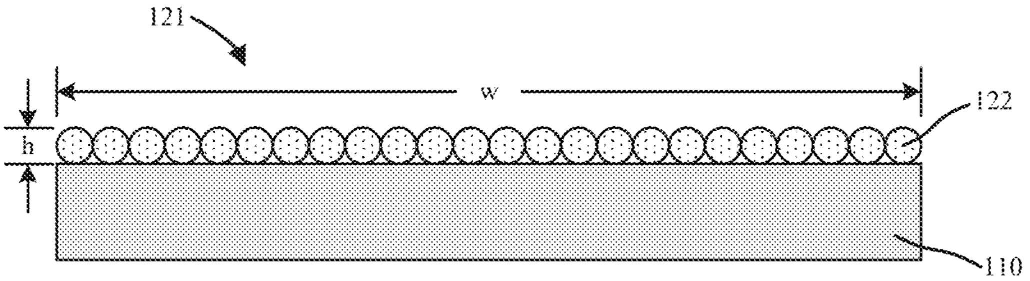
FIG. 3A is a schematic cross-sectional side view illustration of a full monolayer particle layer deposited on a growth substrate in accordance with an embodiment.
Figure 3B:
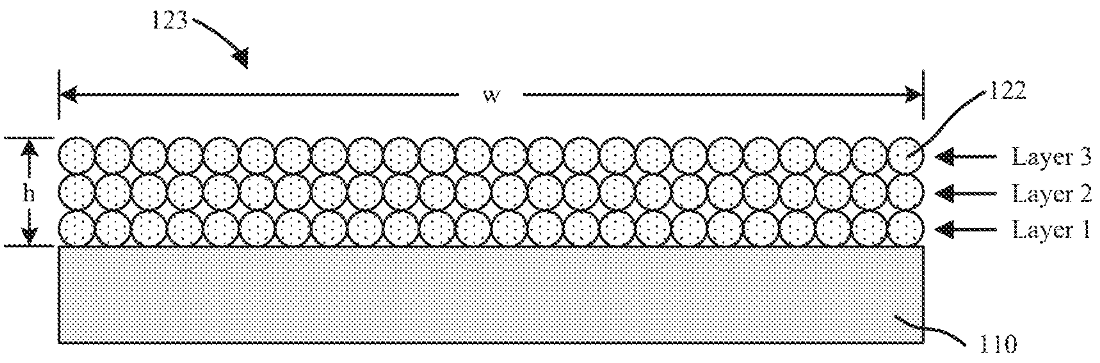
FIG. 3B is a schematic cross-sectional side view illustration of a full multilayer particle layer deposited on a growth substrate in accordance with an embodiment.

Referring now to FIG. 3A and FIG. 3B, FIG. 3A illustrates full monolayer coverage of the top surface of the growth substrate; FIG. 3B illustrates full multilayer coverage of the top surface of the growth substrate. In FIG. 3A, the width, w, of full monolayer particle layer 121 spans the diameter of growth substrate 110. In addition, the height of the full monolayer particle layer 121 may vary based upon the characteristics of the particles, such as size (e.g., nanoparticle, etc.), composition (e.g., metal, semiconductor, etc.), shape/morphology (e.g., spherical, non-spherical, etc.), etc. In the example of FIG. 3A, the height, h, of full monolayer particle layer 121 is the height/diameter of particles 122. For example, where particles 122 are spherical silica nanoparticles, the height/diameter of full monolayer particle layer 121 may be approximately 50 nanometers.

Referring now to FIG. 3B, multiple layers of particles may be deposited on growth substrate 110 to form full multilayer particle layer 123, which includes layers 1, 2 and 3. For example, the particle layer may be formed by deposition methods such as dip-coating, spin-coating, Langmuir-Schaefer coating, Langmuir-Blodgett coating, sol-gel, solvent evaporation, doctor blade coating, spray-coating, vapor deposition processes, electroplating, thermal evaporation, e-beam evaporation, as well as other methods. Where a "dip" procedure is utilized to deposit a monolayer of particles (e.g., Langmuir-Schaefer method, etc.), multiple layers of particles can be deposited by repeating the dipping procedure, for example. The width, w, of full multilayer particle layer 123 spans the diameter of growth substrate 110. In addition, the height of full multilayer particle layer 123 may vary based on the characteristics of the particles, such as size (e.g., nanoparticle, etc.), composition (e.g., metal, semiconductor, etc.), shape/morphology (e.g., spherical, non-spherical, etc.), as well as the number of layers deposited on growth substrate 110. In the example of FIG. 3B, the height, h, of full multilayer particle layer 123 is the cumulative heights of the three levels of particles 122. For example, where particles 122 are spherical silica nanoparticles with approximately 50 nanometer diameters, the height of full monolayer particle layer 121 may be approximately 150 nanometers.

Figure 4A:
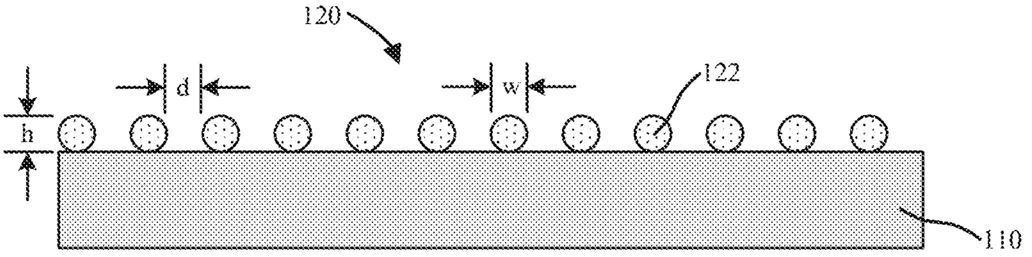
FIG. 4A is a schematic cross-sectional side view illustration of a partial monolayer particle layer deposited on a growth substrate in accordance with an embodiment.
Figure 4B:
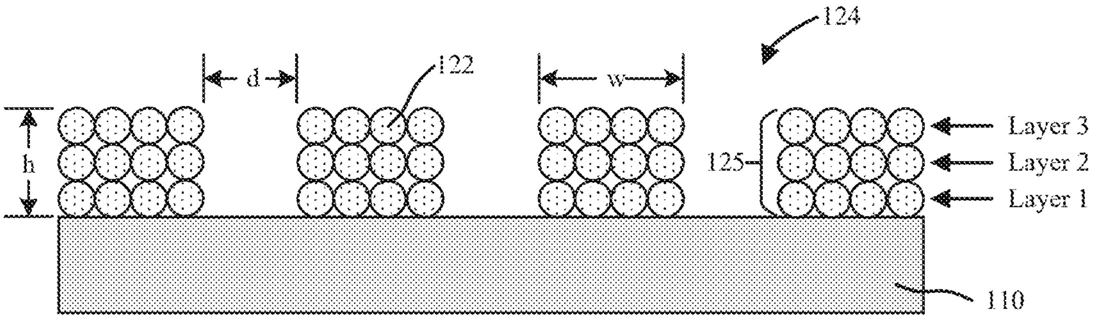
FIG. 4B is a schematic cross sectional side view illustration of a partial multilayer particle layer deposited on a growth substrate in accordance with an embodiment.

Referring now to FIG. 4A and FIG. 4B, FIG. 4A illustrates partial monolayer coverage of the top surface of the growth substrate; FIG. 4B illustrates partial multilayer coverage of the top surface of the growth substrate. For monolayer particle layers that provide partial coverage, the particles can be organized or patterned with different heights, widths and spacings by modifying the deposition process. For example, where a "dip" procedure is utilized to deposit a layer of particles (e.g., Langmuir-Schaefer method, etc.), the particles can be compressed to a desired packing density and then deposited accordingly. Briefly referring back to FIG. 3A, particles 122 may be compressed to a particular packing density so that they remain in contact with each other and clustered together when deposited on growth substrate 110, forming full monolayer particle layer 121. However, in the example of FIG. 4A, particles 122 may be compressed to a less than maximum packing density so that particles 122 include spacing, d, between each other, forming partial monolayer particle layer 120 (similar to particle layer 120 depicted in FIG. 2B). Further, the height, h, and width, w, of partial monolayer particle layer 120 may vary based on the characteristics of the particles, such as size (e.g., nanoparticle, etc.), composition (e.g., metal, semiconductor, etc.), shape/morphology (e.g., spherical, non-spherical, etc.), etc. For example, where particles 122 are spherical silica nanoparticles, the height and width of partial monolayer particle layer 120 may be the diameter of the particles (e.g., approximately 50 nanometers).

Referring now to FIG. 4B, for multilayer particle layers that provide partial coverage, the particles can be organized or patterned with different heights, widths and spacings by applying a mask (e.g., shadow mask, photomask, etc.) on the top surface of the growth substrate before depositing the particles. For example, a shadow mask may be designed for a vapor deposition process (or a photomask may be designed for a dipping process) so that the particles form clusters in the exposed regions defined by the mask, where the clusters of particles may form a pattern that corresponds to the height, width and spacing parameters of partial multilayer particle layer 124. Further, the height, h, and width, w, of partial multilayer particle layer 124 may vary based on the characteristics of the particles, such as size (e.g., nanoparticle, etc.), composition (e.g., metal, semiconductor, etc.), shape/morphology (e.g., spherical, non-spherical, etc.), as well as the number of layers deposited on growth substrate 110 and the spacing, d, between clusters of particles. In the example of FIG. 4B, for partial multilayer particle layer 124, the height, h, of each cluster 125 is the cumulative heights of the three levels of particles 122, and the width, w, of each cluster 125 is the cumulative width of particles 122. For example, where particles 122 are spherical silica nanoparticles with approximately 50 nanometer diameters, the height of partial multilayer particle layer 124 may be approximately 150 nanometers, and the width of partial multilayer particle layer 124 may be approximately 200 nanometers. It should be noted that the various types of coverages may include various types of particle shapes from layer to layer (e.g., spherical particles in layer 1, rod-shaped particles in layer 2, etc.) or even various types of particle shapes within the same layer (e.g., spherical and pyramidal particles in layer 1, etc.). Further, particle shapes may include but are not limited to spheres, squares, rods, plates, pyramids, etc., as well as amorphous shapes that lack definite form. Further, the porosity of each layer may range from 0% (e.g., packed layer) to 80% porosity based on the characteristics of the particles deposited (e.g., shape, size, etc.) as well as the method of deposition.

Figure 5A:
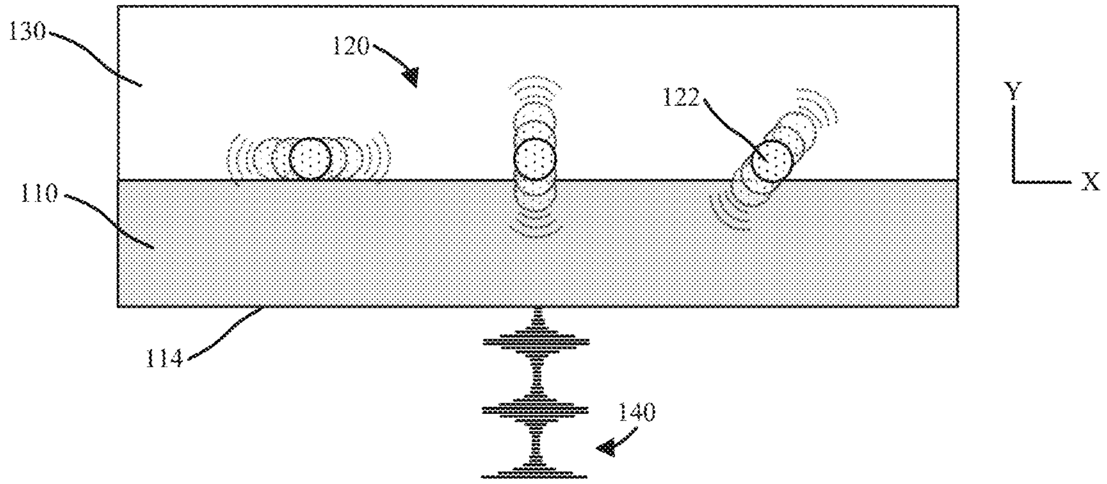
FIG. 5A is a schematic cross sectional side view illustration of a partial monolayer particle layer stimulated by an acoustic wave in accordance with an embodiment.
Figure 5B:
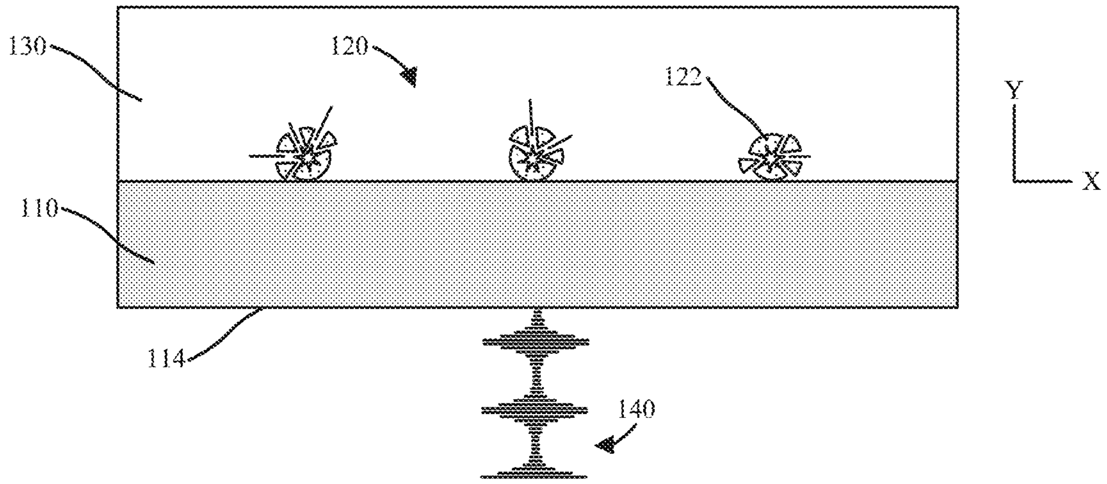
FIG. 5B is a schematic cross sectional side view illustration of a partial monolayer particle layer stimulated by an acoustic wave in accordance with another embodiment.

FIGS. 5A-5B illustrate partial monolayer particle layer 120 and epitaxial layer 130 deposited on growth substrate 110, where acoustic waves 140 stimulate particles 122 to initiate a controlled crack propagation along partial monolayer particle layer 120. In such examples, the frequency of the acoustic waves may be altered or tuned to yield a particular type of particle stimulation. In the example of FIG. 5A, acoustic waves 140 operate at a first frequency to cause particles 122 of partial monolayer particle layer 120 to vibrate with a first amplitude. In other embodiments, acoustic waves 140 may be altered or tuned to a second frequency that matches the natural frequency of particles 122 so that particles 122 resonate with a second amplitude, where the second amplitude is greater than the first amplitude. Further, in response to the acoustic stimulus, the vibration or resonance of the particles in the particle layer may occur in any direction (e.g., x-y-z directions, etc.). In the example of FIG. 5B, acoustic waves 140 operate at a third frequency to cause particles 122 of partial monolayer particle layer 120 to break or burst. In addition to the frequency of the acoustic waves, the manner in which the particles react to the acoustic stimulus (e.g., vibration, resonance, breaking/bursting, etc.) may also be affected by the porosity of the particles in the particle layer. In one example, the particle layer may include mesoporous particles (e.g., mesoporous silica, etc.), where the size of the pores within the mesoporous particles may range from microporous (e.g., less than approximately 2 nanometers) to macroporous (e.g., greater than approximately 50 nanometers). In some instances, particles with greater porosity may require a lesser application of force to stimulate the particles and to ultimately initiate controlled crack propagation.

Further, in addition to utilizing acoustic waves to stimulate the particles in the particle layer (e.g., vibration, resonance, breaking/bursting, etc.), other embodiments may utilize thermal, mechanical or electromagnetic means to stimulate the particles in the particle layer and initiate a controlled crack propagation along the particle layer. For example, in the thermal embodiment, the difference in the coefficient of thermal expansion between the particles in the particle layer and any other surrounding layer (e.g., growth substrate, epitaxial layer, etc.) may create enough stress at the interface to initiate a controlled crack propagation along the particle layer when heated. In the mechanical embodiment, an optimal load and/or moment applied to the growth substrate and/or the epitaxial layer may create enough stress at the interface to initiate a controlled crack propagation along the particle layer. In the electromagnetic embodiment, photoexcitation of the particles in the particle layer at the surface plasmon resonance may heat the particles, which may cause them to burst and then initiate a controlled crack propagation.

Figure 6A:
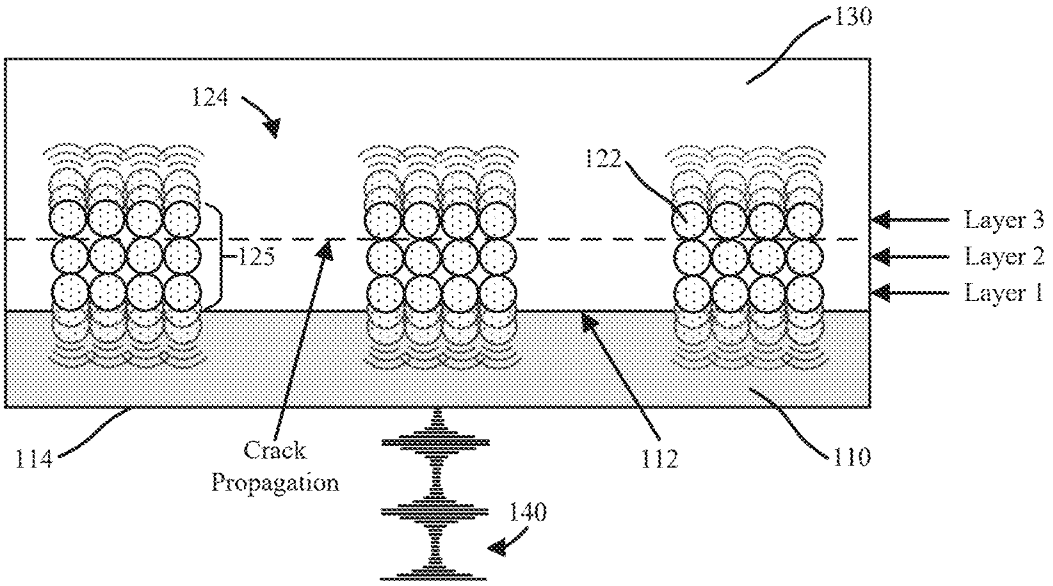
FIG. 6A is a schematic cross sectional side view illustration of a controlled crack propagation through an epitaxial layer in accordance with an embodiment.
Figure 6B:
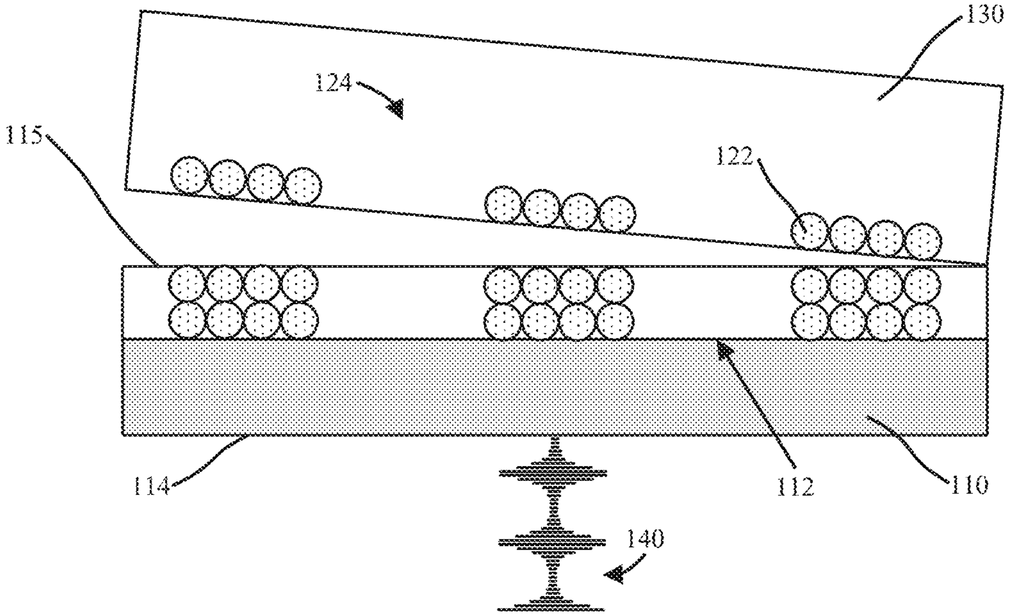
FIG. 6B is a schematic cross sectional side view illustration of a second top surface formed by the controlled crack propagation through the epitaxial layer in FIG. 6A.

Referring now to FIGS. 6A-6B, FIG. 6A illustrates controlled crack propagation that occurs through an epitaxial layer; FIG. 6B illustrates a second top surface formed after controlled crack propagation through the epitaxial layer. FIG. 6A illustrates partial multilayer particle layer 124 (including clusters 125) and epitaxial layer 130 deposited on first top surface 112 of growth substrate 110, where partial multilayer particle layer 124 includes particles 122 stimulated by acoustic waves 140. Further, partial multilayer particle layer 124 also includes layers 1, 2 and 3. In FIG. 6A, based on the frequency of acoustic waves 140, the characteristics of particles 122 (e.g., size, porosity, composition, shape, etc.) and the characteristics of the surrounding layers (e.g., growth substrate 110, epitaxial layer 130), the minimal stress required to propagate a crack for controlled crack propagation may occur within epitaxial layer 130 between layers 2 and 3. In other instances, controlled crack propagation may occur between or through any other layer in partial multilayer particle layer 124 or even above an uppermost layer such as layer 3, for example. Briefly referring back to FIG. 2D, the controlled crack propagation occurred along partial monolayer particle layer 120 to form second top surface 113 after epitaxial layer 130 separated from growth substrate 110. Here, in the example of FIG. 6B, the controlled crack propagation occurs between layers 2 and 3 of partial multilayer particle layer 124 to form second top surface 115, where second top surface 115 includes epitaxial layer 130.

Figure 7A:
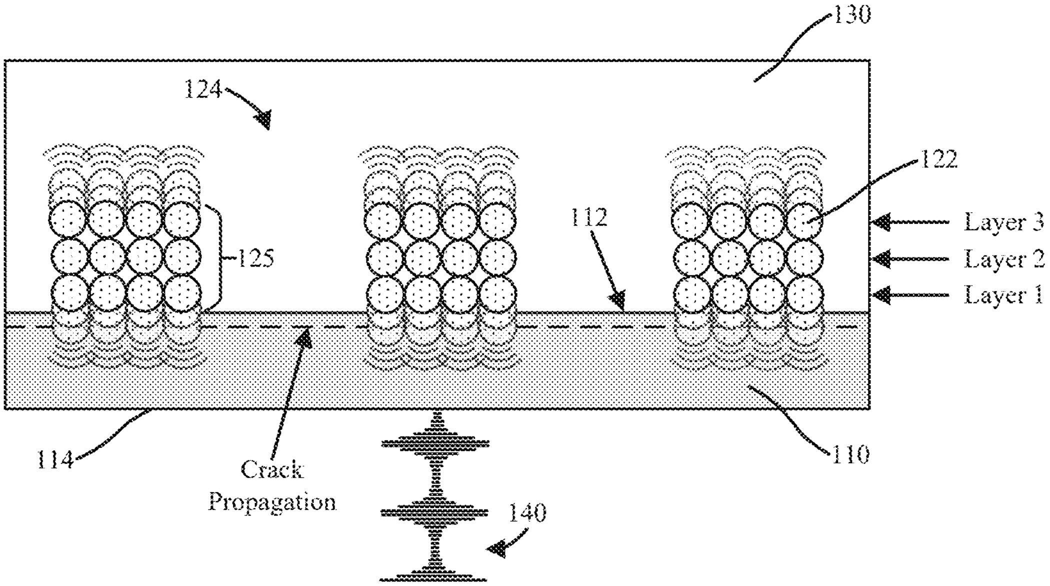
FIG. 7A is a schematic cross sectional side view illustration of a controlled crack propagation through a growth substrate in accordance with an embodiment.
Figure 7B:
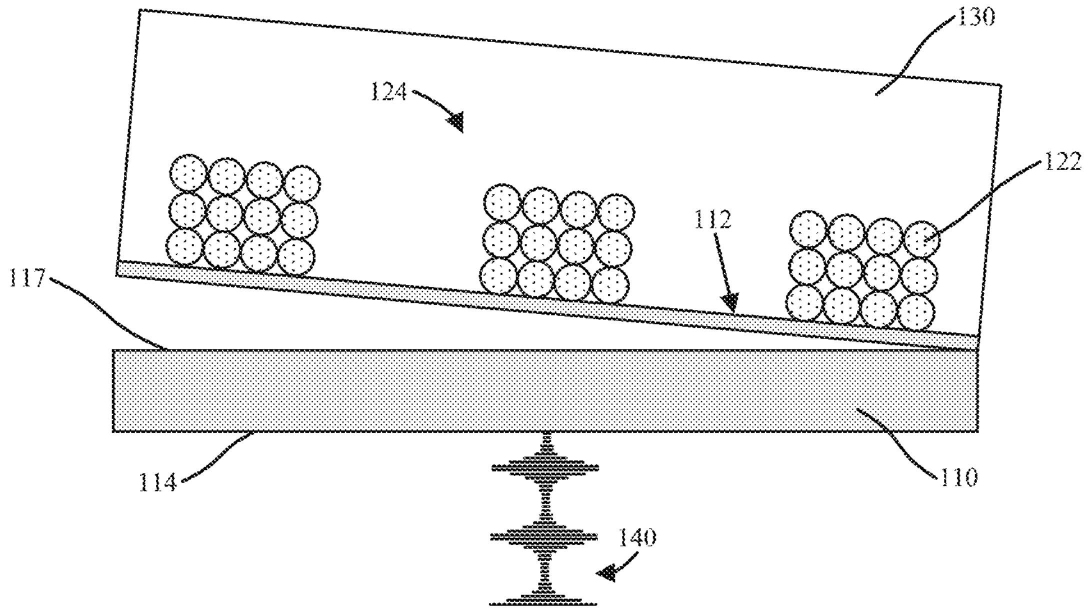
FIG. 7B is a schematic cross sectional side view illustration of a second top surface formed by the controlled crack propagation through the growth substrate in FIG. 7A.

Referring now to FIG. 7A-7B, FIG. 7A illustrates controlled crack propagation that occurs through a growth substrate; FIG. 7B illustrates a second top surface formed after controlled crack propagation through the growth substrate. FIG. 7A illustrates partial multilayer particle layer 124 (including clusters 125) and epitaxial layer 130 deposited on first top surface 112 of growth substrate 110, where partial multilayer particle layer 124 includes particles 122 stimulated by acoustic waves 140. Further, the partial multilayer particle layer 124 also includes layers 1, 2 and 3. In examples, controlled cracked propagation may occur at or along the interface of growth substrate 110 and epitaxial layer 130 or at a location below the interface so that the crack propagates through growth substrate 110. In the example of FIG. 7A, based on the frequency of acoustic waves 140, the characteristics of particles 122 (e.g., size, porosity, composition, shape, etc.) and the characteristics of the surrounding layers (e.g., growth substrate 110, epitaxial layer 130), the minimal stress required to propagate a crack for controlled crack propagation occurs below the interface of growth substrate 110 and epitaxial layer 130, so that the controlled crack propagates through growth substrate 110. As such, in the example of FIG. 7B, the controlled crack propagation forms second top surface 117, where second top surface 117 includes growth substrate 110.

Figure 8A:
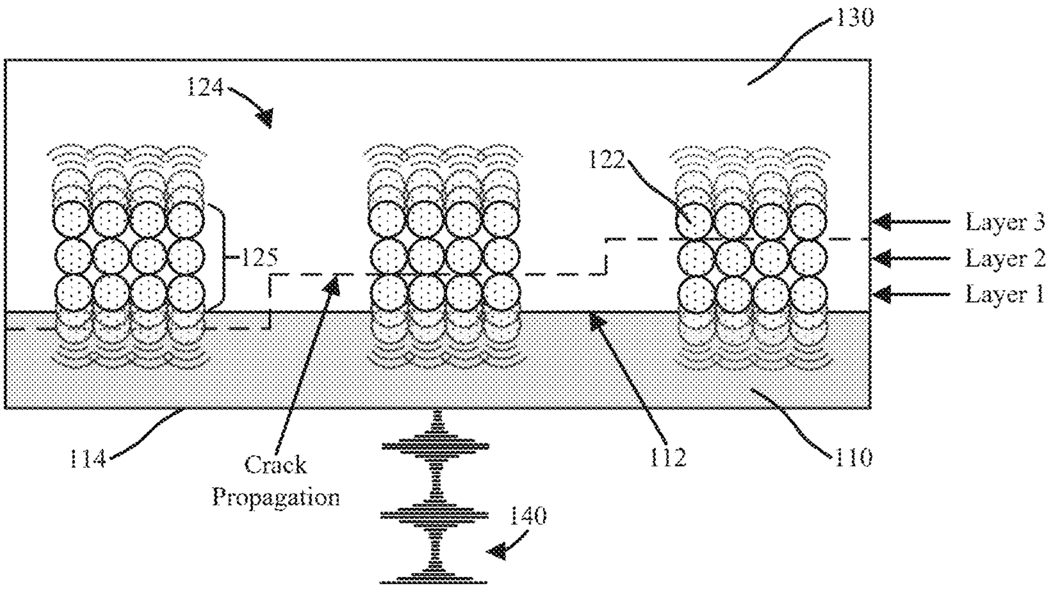
FIG. 8A is a schematic cross sectional side view illustration of a controlled crack propagation through a growth substrate and an epitaxial layer in accordance with an embodiment.
Figure 8B:
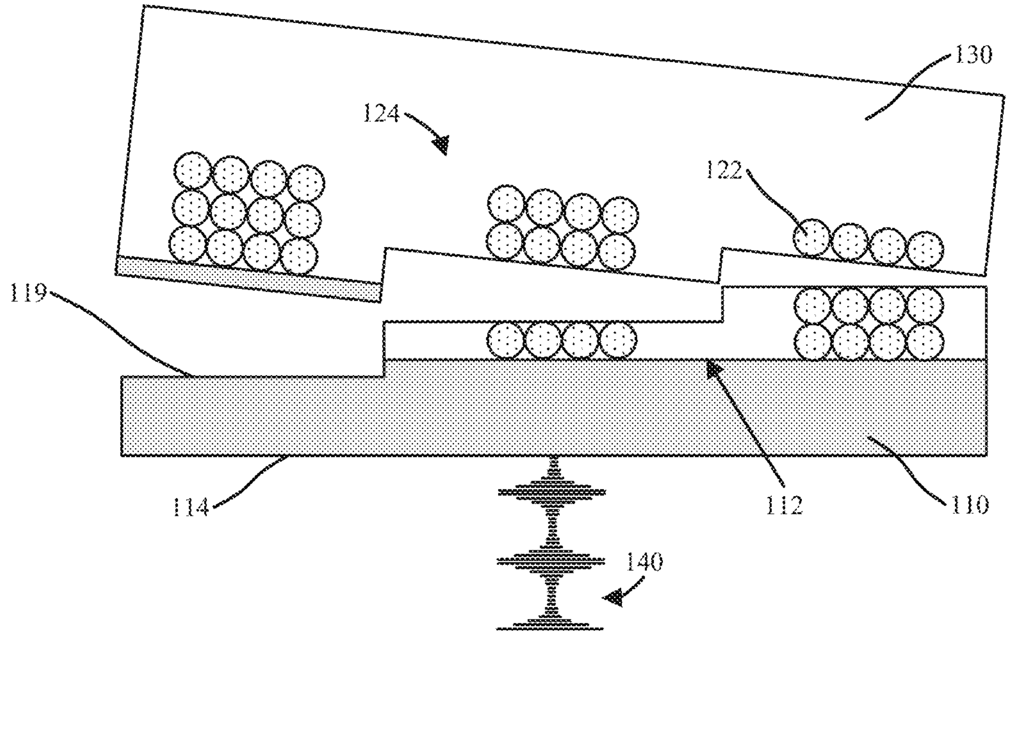
FIG. 8B is a schematic cross sectional side view illustration of a second top surface formed by the controlled crack propagation through the growth substrate and the epitaxial layer in FIG. 8A.

Referring now to FIG. 8A-8B, FIG. 8A illustrates controlled crack propagation that occurs through a growth substrate and an epitaxial layer; FIG. 8B illustrates a second top surface formed after controlled crack propagation through the growth substrate and the epitaxial layer. FIG. 8A illustrates partial multilayer particle layer 124 (including clusters 125) and epitaxial layer 130 deposited on first top surface 112 of growth substrate 110, where partial multilayer particle layer 124 includes particles 122 stimulated by acoustic waves 140. Further, partial multilayer particle layer 124 also includes layers 1, 2 and 3. In the example of FIG. 8A, based on the frequency of acoustic waves 140, the characteristics of particles 122 (e.g., size, porosity, composition, shape, etc.), and the characteristics of the surrounding layers (e.g., growth substrate 110, epitaxial layer 130), the minimal stress required to propagate a crack for controlled crack propagation may cause the crack to initiate in one layer (e.g., growth substrate 110) and terminate in another layer (e.g., epitaxial layer 130). For example, controlled crack propagation may initiate in a layer below first top surface 112 (e.g., growth substrate 110) and may terminate above first top surface 112 (e.g., epitaxial layer 130) or vice versa. Specifically, in the example of FIG. 8A, controlled crack propagation initially occurs within growth substrate 110 but then "jumps" to epitaxial layer 130 between layers 1 and 2 of partial multilayer particle layer 124 and then jumps again between layers 2 and 3. In some instances, the controlled crack propagation may "jump back" to layer 1 or to another different layer (e.g., back to growth substrate 110, etc.). Referring now to FIG. 8B, the controlled crack propagation forms second top surface 119, where second top surface 119 includes both growth substrate 110 and epitaxial layer 130. It should be noted that the controlled crack propagations described herein are not exhaustive but merely illustrative of the types of crack propagation or paths of crack propagation that may occur based on the characteristics of the particles and surrounding layers as well as the stimulus applied to the particle layer.

Figure 9A:
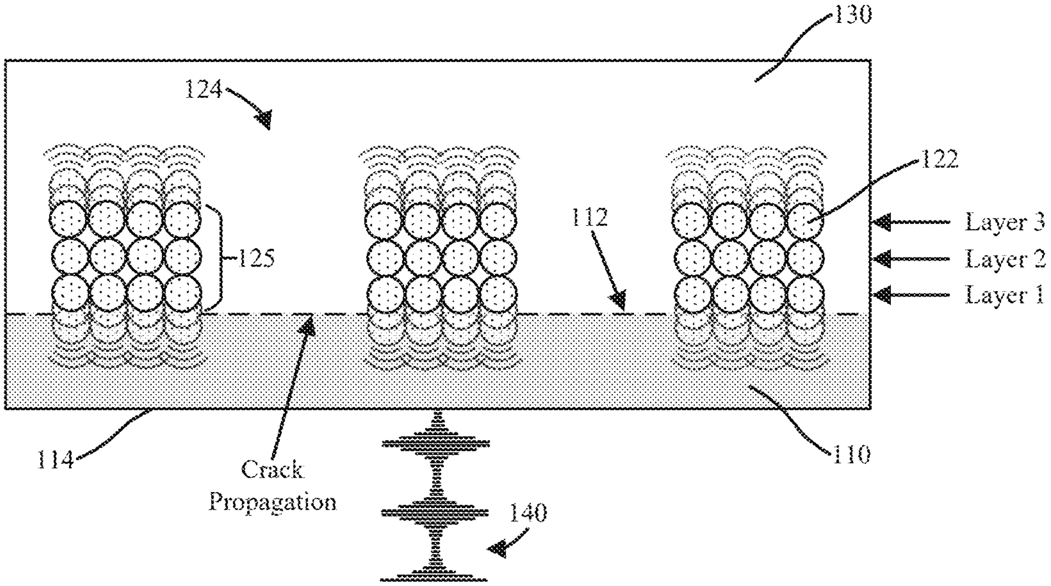
FIG. 9A is a schematic cross sectional side view illustration of a controlled crack propagation along an interface between a growth substrate and an epitaxial layer in accordance with an embodiment.
Figure 9B:
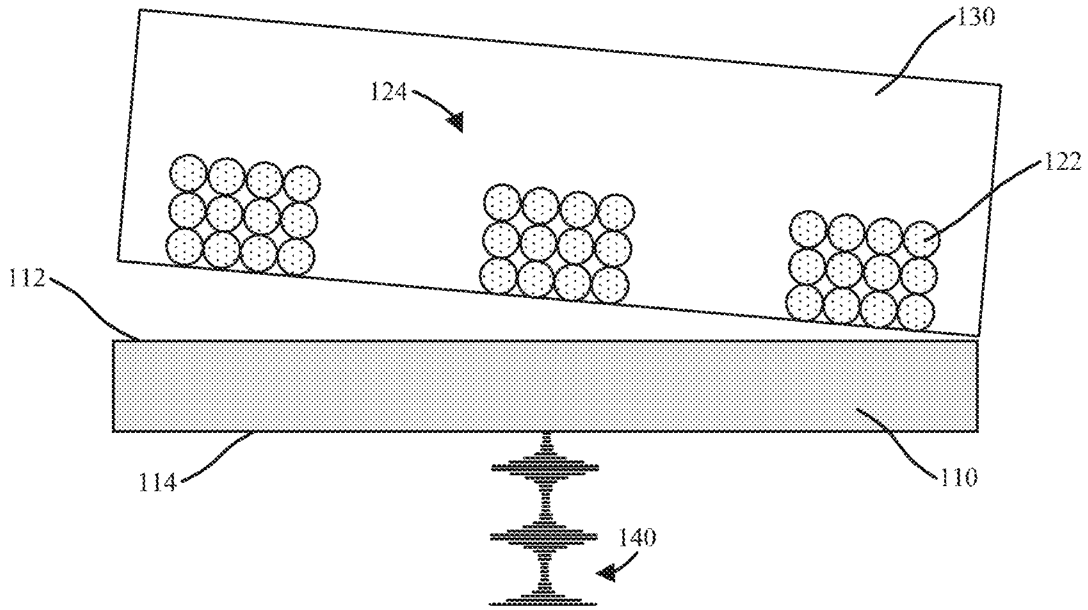
FIG. 9B is a schematic cross sectional side view illustration of a first top surface after controlled crack propagation along the interface between the growth substrate and the epitaxial layer in FIG. 9A.

Referring now to FIG. 9A-9B, FIG. 9A illustrates controlled crack propagation that occurs along the interface between the epitaxial/particle layer and the growth substrate; FIG. 9B illustrates a first top surface after controlled crack propagation along the interface. FIG. 9A illustrates partial multilayer particle layer 124 (including clusters 125) and epitaxial layer 130 deposited on first top surface 112 of growth substrate 110, where partial multilayer particle layer 124 includes particles 122 stimulated by acoustic waves 140. Further, the partial multilayer particle layer 124 also includes layers 1, 2 and 3. In some embodiments, crack propagation may occur along the interface between the epitaxial/particle layer and the growth substrate. In the example of FIG. 9A, based on the frequency of acoustic waves 140, the characteristics of particles 122 (e.g., size, porosity, composition, shape, etc.) and the characteristics of the surrounding layers (e.g., growth substrate 110, epitaxial layer 130), the minimal stress required to propagate a crack for controlled crack propagation occurs at the interface between epitaxial layer 130 (and partial multilayer particle layer 124) and first top surface 112 of growth substrate 110. As such, in the example of FIG. 9B, the controlled crack propagation "exposes" top surface 112 of growth substrate 110 rather than forming a new top surface of growth substrate 110.

In utilizing the various aspects of the embodiments, it would become apparent to one skilled in the art that combinations or variations of the above embodiments are possible for acoustically separating epitaxial layers from a growth substrate. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A method for acoustically separating an epitaxial layer or device from a growth substrate comprising:

depositing a particle layer on a first top surface of a growth substrate, the particle layer including particles that provide at least partial coverage of the first top surface of the growth substrate;

depositing an epitaxial layer over the particle layer and a remaining uncovered portion of the first top surface of the growth substrate; and directing acoustic waves at the growth substrate, wherein the acoustic waves stimulate the particles of the particle layer to initiate a controlled crack propagation along the particle layer;

wherein the controlled crack propagation causes the epitaxial layer to separate from the first top surface of the growth substrate and create a second top surface of the growth substrate.

2. The method of claim 1, wherein the particle layer is a monolayer particle layer that provides partial coverage of the first top surface.

3. The method of claim 1, wherein the particle layer is a multilayer particle layer that provides partial coverage of the first top surface.

4. The method of claim 1, wherein the particles are mesoporous particles.

5. The method of claim 1, wherein the acoustic waves stimulate the particle layer by causing the particles of the particle layer to vibrate.

6. The method of claim 1, wherein the acoustic waves stimulate the particle layer by causing the particles of the particle layer to resonate.

7. The method of claim 1, wherein the acoustic waves stimulate the particle layer by causing the particles of the particle layer to break.

8. The method of claim 1, wherein the controlled crack propagation occurs above the first top surface so that the second top surface includes the epitaxial layer.

9. The method of claim 1, wherein the controlled crack propagation occurs below the first top surface so that the second top surface includes the growth substrate.

10. The method of claim 1, wherein the controlled crack propagation initiates below the first top surface of the growth substrate and terminates above the first top surface of the growth substrate so that the second top surface includes both the growth substrate and the epitaxial layer.

11. The method of claim 1, wherein the controlled crack propagation occurs along an interface between the epitaxial layer and the first top surface of the growth substrate.

12. The method of claim 1, wherein the particle layer is a monolayer particle layer that provides full coverage of the first top surface.

13. The method of claim 1, wherein the particle layer is a multilayer particle layer that provides full coverage of the first top surface.

14. The method of claim 1, further comprising applying a mask to the first top surface of the growth substrate and depositing clusters of particles on the first top surface of the growth substrate, wherein the clusters of particles correspond to a pattern of the particle layer.

15. The method of claim 14, wherein the mask is a shadow mask and depositing the clusters of particles includes a vapor deposition process.

16. The method of claim 14, wherein the mask is a photomask and depositing the clusters of particles includes a dipping process.

17. The method of claim 14, wherein the mask is a photomask and depositing the clusters of particles includes a spin-coating process.

18. The method of claim 1, wherein directing acoustic waves at the growth substrate includes directing acoustic waves at one or more surfaces of the growth substrate or the epitaxial layer.

19. The method of claim 1, wherein directing acoustic waves at the growth substrate includes utilizing an acoustic lift-off apparatus, the acoustic lift-off apparatus including an electronic system and an acoustic system.

20. The method of claim 19, the acoustic system includes an acoustic device, the acoustic device including one or more acoustic generators.

* * * * *